(12) United States Patent
Liu et al.

(10) Patent No.: US 9,639,644 B1
(45) Date of Patent: May 2, 2017

(54) METHOD AND APPARATUS FOR MASTER-CLONE OPTIMIZATION DURING CIRCUIT ANALYSIS

(71) Applicant: Cadence Design Systems, Inc., San Jose, CA (US)

(72) Inventors: Dongzi Liu, Fremont, CA (US); Deng Pan, Newark, CA (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 6 days.

(21) Appl. No.: 14/606,559

(22) Filed: Jan. 27, 2015

(51) Int. Cl.
 *G06F 17/50* (2006.01)
(52) U.S. Cl.
 CPC .................. *G06F 17/5045* (2013.01)
(58) Field of Classification Search
 CPC .......... G06F 17/5072; G06F 17/5045
 See application file for complete search history.

(56) References Cited

U.S. PATENT DOCUMENTS

| | | | | |
|---|---|---|---|---|
| 2002/0073380 | A1* | 6/2002 | Cooke | G06F 17/5045 716/102 |
| 2006/0031803 | A1* | 2/2006 | Eichenseer | G06F 17/5072 716/123 |
| 2014/0222383 | A1* | 8/2014 | Eitzman | G06F 17/50 703/1 |
| 2014/0337811 | A1* | 11/2014 | Knapp | G06F 17/505 716/104 |

\* cited by examiner

*Primary Examiner* — Vuthe Siek
(74) *Attorney, Agent, or Firm* — Arnold & Porter Kaye Scholer, LLP (57) ABSTRACT

A system, method and/or computer program for optimizing a circuit design. In some embodiments, a target block with an external boundary and external boundary pins is identified in an integrated circuit design. An area outside the target block is converted into a first macro, wherein the first macro has a physical library and a timing library and wherein the physical library has an internal boundary that corresponds to the external boundary of the target block and wherein the physical library has internal boundary pins that correspond to the external boundary pins of the target block. The target block is represented as a single block netlist and the block netlist is optimized with respect to the first macro. The steps may be repeated with respect to a master and clone(s) on the same integrated circuit enabling a single block netlist to be optimized for multiple instances of the same design IP.

21 Claims, 4 Drawing Sheets

United States Patent US 9,639,644 B1

METHOD AND APPARATUS FOR MASTER-CLONE OPTIMIZATION DURING CIRCUIT ANALYSIS

FIELD

This patent document relates to the field of circuit simulation, and more precisely to the optimization of large circuit designs. The methods and systems may be especially useful for circuits that include master-clone scenarios.

BACKGROUND

Large modern integrated circuit (IC) designs are increasingly created by assembling a number of previously-designed circuit portions, which is done to reduce design turnaround times. Schematic and layout information for such circuit portions may be exchanged or licensed as design intellectual property (IP).

The requirements and demands on ICs have increased steadily over the past decade. As the IC's have become more complicated, their analysis and optimization has also become more complicated. Demands on the software and hardware used for analysis and optimization of complicated IC's may exceed their capabilities. To this end, it would be beneficial to formulate methods and systems that simplify the analysis and optimization of large and/or complicated ICs.

One result of the more stringent requirements and demands on the performance of ICs is the use of parallel chip architectures. Parallel architectures provide multiple instances of the same design IP integrated onto a single circuit die, or onto multiple dies in a single chip package. One example of a parallel architecture is a multi-core processor.

A multi-core processor is a single computing component with two or more independent actual central processing units (called "cores"), which are the units that read and execute program instructions. Multicore processors may have two cores, four cores, or more. Multi-core processors are widely used across many application domains including general-purpose, embedded, network, digital signal processing (DSP), and graphics.

When a single IC includes multiple instances of the same design IP, one instance may be referred to as the master while additional instances may be referred to as clones. Master-clone optimization has been a challenge in hierarchical design flow due to a number of factors: 1. The traditional timing budget approach leads to inaccurate and static interface timing info, which may degrade optimization quality of results (QoR); 2. Newly developed methodologies to account for accurate interface timing such as Reverse Interface Logic Model (ReverseILM) produce different external timing and physical context for each master-clone instance, which may lead to difficult iterative master-clone sync up.

SUMMARY OF THE EMBODIMENTS

In view of the foregoing, an object according to one aspect of the present patent document is to provide methods, systems and apparatus for optimization in timing analysis and other circuit analysis. In a preferred embodiment, the methods, systems and apparatus may be used for optimizing a circuit that includes at least one master and at least once clone. Preferably the methods, systems and apparatus address, or at least ameliorate one or more of the problems described above. To this end, a computer-implemented method for optimizing a circuit design is provided. In certain embodiment, the method comprises: identifying a target block with an external boundary and external boundary pins in an integrated circuit design; converting an area outside the target block into a first macro, wherein the first macro has a physical library and a timing library and wherein the physical library has an internal boundary that corresponds to the external boundary of the target block and wherein the physical library has internal boundary pins that correspond to the external boundary pins of the target block; representing the target block as a single block netlist; and, using a computer, optimizing the block netlist with respect to the first macro.

In some embodiments, certain steps of the method may be repeated for multiple instances of the same design IP. In some embodiments, the identifying and converting steps are performed with both a master and a clone as the target block forming a first macro and a second macro, and both the master and clone are represented by a single block netlist in the representing step, and the block netlist is optimized with respect to both the first and second macro in the optimizing step.

In other embodiments, the identifying and converting steps are performed with both a first piece of design IP and a second identical piece of design IP as the target block forming a first macro and a second macro, and both the first piece of design IP and the second piece of design IP are represented by a single block netlist in the representing step, and the block netlist is optimized with respect to both the first and second macro in the optimizing step.

In some embodiments, the first macro is a donut macro. In yet other embodiments, the physical library is a cloud library. In still yet other embodiments, the physical library includes information that corresponds to the external boundary of the integrated circuit and the information that corresponds to the external boundary of the integrated circuit is not used during the optimizing step.

The area outside the target block may be any size or shape and may correspond to any portion of the integrated circuit. However, preferably, the area outside the target block corresponds to the entire area of the integrated circuit outside the target block.

In some embodiments, the optimizing step further comprises defining a first mode/corner definition for a first timing library of the first macro and a second mode/corner definition for a second timing library of the second macro and combining the first mode/corner definition and the second mode/corner definition into a single multi-mode multi-corner definition and optimizing the block netlist using the multi-mode multi-corner definition.

Although the methods described here may be used in conjunction with any type of analysis, they may be particularly advantageous when used with a ReverseILM analysis.

Although the methods described here may be used to optimize any property of the target block, they are preferably used to optimize timing. Other properties that may be optimized may include a property selected from the group consisting of performance, power and area.

Moreover, the methods and systems described herein may be used with any type of design IP. In particular, the methods and systems may be used in the analysis of an integrated circuit that includes more than one instance of the same design IP. In preferred embodiments, the methods are used with an integrated circuit that includes a master and clone(s). In some embodiments, the master and clone(s) may both be processor cores.

In another aspect of the present patent document, a computer-implemented method for optimizing a circuit design is provided. In certain embodiments, the method comprises: identifying a master and a clone in an integrated circuit design; converting an area outside the master into a first macro with internal boundary pins corresponding to the external boundary pins of the master and external boundary pins corresponding to chip input output pins; converting an area outside the clone into a second macro with internal boundary pins corresponding to the external boundary pins of the clone and external boundary pins corresponding to the chip input output pins; representing both the master and the clone with a single block netlist; and, using a computer, optimizing the block netlist with respect to the first macro and the second macro.

In some embodiments, the optimizing step further comprises defining a first mode/corner definition for a first timing library of the first macro and a second mode/corner definition for a second timing library of the second macro and combining the first mode/corner definition and the second mode/corner definition into a single multi-mode multi-corner definition and optimizing the block netlist using the multi-mode multi-corner definition.

As described more fully below, systems, methods and apparatuses for optimizing a circuit design are provided. Further aspects, objects, desirable features, and advantages of the apparatus, systems, and methods disclosed herein will be better understood from the detailed description and drawings that follow in which various embodiments are illustrated by way of example. It is to be expressly understood, however, that the drawings are for the purpose of illustration only and are not intended as a definition of the limits of the claimed invention.

DETAILED DESCRIPTION OF THE EMBODIMENTS

The following detailed description includes representative examples utilizing numerous features and teachings, both separately and in combination, and describes numerous embodiments in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

Some portions of the detailed descriptions that follow are presented in terms of algorithms and sequences of operations which are performed within a computer memory. These algorithmic descriptions and representations are the means used by those skilled in the data processing arts to most effectively convey the substance of their work to others skilled in the art. An algorithm or sequence of operations is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing," "computing," "calculating," "determining," "displaying" or the like, refer to the action and processes of a computer system, or similar electronic device, that manipulates and transforms data represented as physical (electronic) quantities within the computer system's registers and memories into other data similarly represented as physical quantities within the electronic device's memory or registers or other such information storage, transmission or display devices.

The embodiments disclosed also relate to an apparatus for performing the operations herein. This apparatus may be specially constructed for the required purposes, or it may comprise a general purpose processor selectively activated or reconfigured by a computer program stored in the electronic device. Such a computer program may be stored in a computer readable storage medium, such as, but is not limited to, any type of disk, including floppy disks, optical disks, CD-ROMs, and magnetic-optical disks, read-only memories (ROMs), random access memories (RAMs), EPROMs, EEPROMs, Flash memory, magnetic or optical cards, or any type of media suitable for storing electronic instructions, and each coupled to a computer system bus.

The algorithms presented herein are not inherently related to any particular electronic device or other apparatus. Various general purpose systems may be used with programs in accordance with the teachings herein, or it may prove convenient to construct a more specialized apparatus to perform the required method steps. The required structure for a variety of these systems will appear from the description below. It will be appreciated that a variety of programming languages may be used to implement the teachings of the embodiments as described herein.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of original disclosure, as well as for the purpose of restricting the claimed subject matter. It is also expressly noted that the dimensions and the shapes of the components shown in the figures are designed to help understand how the present teachings are practiced, but not intended to limit the dimensions and the shapes shown in the examples.

The methods, systems and apparatus of the present patent document use external macros in order to provide efficiencies during the optimization of a circuit design. In particular, the methods, systems and apparatus described herein use donut macros and cloud libraries in order to provide efficiencies during the optimization of a circuit design. These techniques may be used with any type or level of circuit optimization and may be applied in order to optimize timing, performance, power, area or any other aspect of the circuit.

Figure 1:
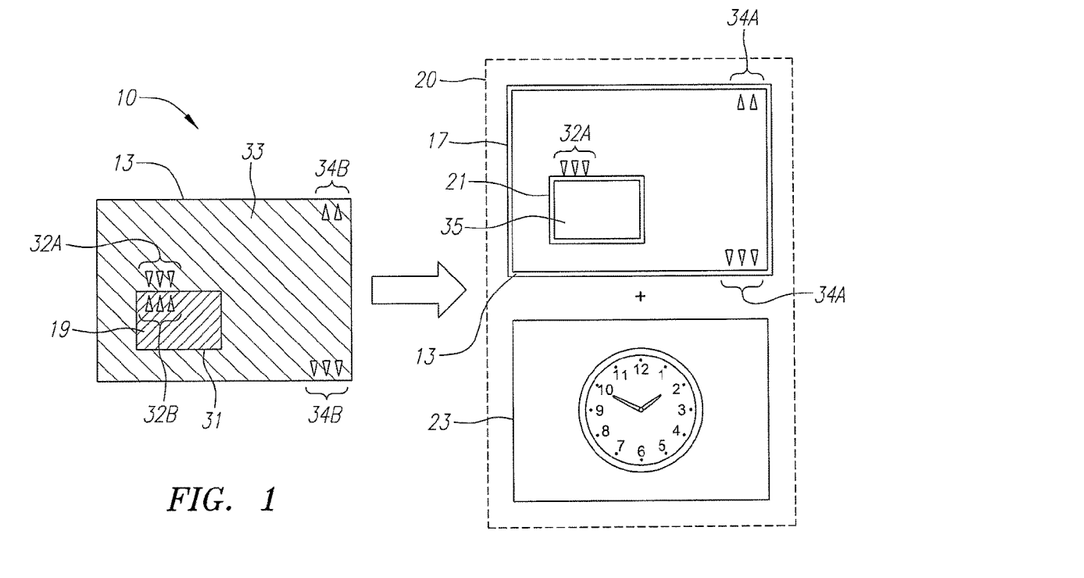
FIG. 1 illustrates one embodiment of an area outside a target block of an integrated circuit (IC) design being represented by a macro.

FIG. 1 illustrates one embodiment of an area 33 outside a target block 19 of an integrated circuit (IC) design 10 being represented by a macro 20. The area 33 outside a target block 19 is converted into a macro 20 in order to gain efficiencies when optimizing the circuit as will be explained herein.

As may be seen in FIG. 1, the IC 10 may have an external boundary 13 and external boundary pins 34B. The target block 19 may also have an external boundary 31 with external boundary pins 32B. The IC will have internal boundary pins 32A that correspond to the external boundary pins 32B of the target block 19.

The target block 19 may be selected as any portion of the IC 10 that the designer wishes to optimize. In certain embodiments, the target block 19 corresponds to a region associated with a particular piece of design IP. For example, the target block 19 may comprise a circuit portion that was previously designed and is now being used to assemble a new integrated circuit. It is also possible that multiple target blocks 19 are selected, each target block 19 selected by a circuit designer, for example, to include multiple previously designed circuit portions that share a common clock domain.

After the portion of the IC 10 the designer wishes to optimize is identified as the target block 19, an area 33 outside the target block 19 is converted into an external macro 20. A macro 20 is a representation of the area 33 to be analyzed. In embodiments described herein, a macro 20 is used to represent an area 33 outside the target block 19 during optimization of the target block 19.

A macro 20 may be any description of the area 33 outside the target block 19. In preferred embodiments, the macro is broken into two separate portions: 1. A physical library 17; and, 2. A timing library 23. The physical library 17 represents the physical attributes of the area 33 outside the target block 19. The physical library 17 may include information about both the physical shape of the area outside the target block 19 and the locations of the boundary pins in the area outside the target block 19. In certain embodiments, the physical library 17 of the macro 20 includes information about the external boundary 13 of the chip, external boundary pins 34A of the chip, internal boundary 21, which corresponds to the external boundary 31 of the target block 19 and, internal boundary pins 32A, which correspond to the external boundary pins 32B of the target block 19. In other embodiments, other physical information may be contained in the physical library 17 of the macro 20. As explained below, less information may also be contained in the physical library 17.

In a preferred embodiment, the physical library 17 of the macro 20 may be in the format of a library exchange file ("LEF"). The LEF file defines the elements of an IC process technology and associated library of cell models. In other embodiments, the physical library 17 may use the design exchange format ("DEF"). In yet other embodiments, the physical library may use any other type of physical library format. The LEF and DEF file formats are described in LEF/DEF Language Reference, Product Version 5.7 Nov. 2009, which is herein incorporated by reference in its entirety.

The second portion of the macro 20 is a timing library 23. The timing library 23 represents the timing information of the area 33 outside the target block 19. In some embodiments, the timing library 23 is an ASCII representation of the timing and power parameters associated with the area 33 outside the target block 19. In certain embodiments, the timing file may include timing models and data to calculate: I/O delay paths; Slew, Load, Timing check values; and, Interconnect delays. In a certain embodiment, the timing library 23 conforms to the *.LIB format. However, in other embodiments, other file formats may be used for timing library 23.

Because the macros 20 of the present patent document represent an area 33 outside, or external to, a target block 19, the macros 20 contain a hole 35 for the target block 19. Accordingly, the macros 20 may be referred to as a donut macro 20. A donut macro 20 has an internal boundary definition 21 that corresponds to the external boundary 31 of the target block 19. This internal boundary definition 21 defines the hole 35. In addition, the donut macro 20 includes a definition for internal boundary pins 32A corresponding to the external boundary pins 32B of the target block 19.

The donut macro 20 may also have a definition of its external boundary 13 and the boundary pins associated therewith 34A. Although the external boundary 13 may be defined as an area other than the entire chip, in a preferred embodiment, the external boundary 13 is defined by the full chip outside the target block 19. Accordingly, the donut macro 20 includes a definition of the external boundary 13 of the chip and external boundary pins 34A corresponding to chip input output pins 34B.

As part of the creation of the donut macro 20, the timing information for the external area 33 is extracted into the timing library 23. Once the timing information is extracted, the physical information related to the external boundary 13 and the external boundary pins 34A is no longer needed as part of the donut macro 20. To this end, in certain embodiments, the physical information about the external boundaries 13 and external boundary pins 34A may be removed from the donut macro 20 to form a cloud library.

Figure 2:
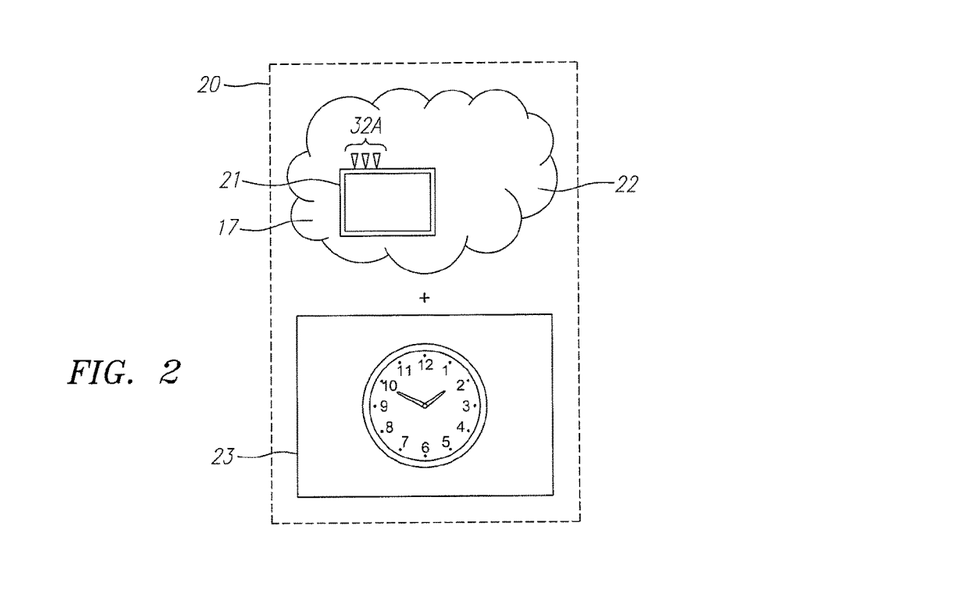
FIG. 2 illustrates the macro of FIG. 1 with a cloud library used as the physical library.

FIG. 2 represents a donut macro 20 wherein the external boundary information has been removed from the physical description portion 17 of the macro 20. Accordingly, the physical library 17 of the donut macro 20 may be referred to as a cloud library 22. A cloud library 22 includes only the physical information related to the internal boundary 21 and the internal pins 32A of the area 33 outside the target block 19. Although in some embodiments, the physical information about the external boundary 13 and external boundary pins 34A may be removed from the donut macro 20, in other embodiments, the physical information about the external boundary 13 and external boundary pins 34A may remain but are simply ignored or not used during optimization.

To summarize, the circuit information in an area 33 outside the boundary of the target block 19 is represented in the form of a macro 20. In preferred embodiments, the macro 20 is composed of two portions. The physical library 17 represents the physical information of the area outside the target block 19 including an internal boundary 21 and internal boundary pins 32A. This physical library 17 of the area 33 external to the target block 19 including internal boundary 13 and pin information 32A may be referred to as a cloud library 22. The second portion of the macro 20 represents the timing information 23 about the area 33 outside the target block 19.

After the donut macro 20 is created, the target block 19 may be optimized in the presence of the donut macro 20. In preferred embodiments, the target block 19 is represented as a single block netlist and optimized in the presence of the donut macro 20. In other embodiments, the donut macro 20 is converted into a cloud library 22 and timing library 23 and the target block 19 is optimized using the cloud library 22 and timing library.

Although a donut macro 20 may be used to optimize a single instance of a target block 19 on an IC, using a donut macro provides additional benefits when the area inside the target block is a portion of the IC that is repeated over the chip. For example, if the target block 19 represents a specific piece of design IP that occurs multiple times throughout the IC, the methods described herein may be particularly useful. In particular, multiple instances of the same target block 19 may still be represented by a single block netlist while the different external environments are represented by multiple donut macros 20. In certain embodiments, the methods may be used with an IC design that contains a master and multiple clones of the same design IP.

A short background about interface logic model ("ILM") and reverse interface logic model ("ReverseILM") will now be summarized; a more detailed description of ILM is provided in references such as U.S. Pat. Nos. 7,039,887, 7,930,675, 7,941,774, and U.S. Patent Application Publication No. 2012/0254818, which are each incorporated herein by reference. The ILM has arisen from the availability and use of previously designed circuit portions, which may be supplied as gate-level netlists, low level representations of logic designs, or as a higher abstraction level description such as a hardware description language. The general idea of an ILM is to minimize the amount of a design that must be analyzed and optimized using the most detailed circuit description, while still taking into account any significant effects of other portions of the circuit design.

For example, the suppliers of previously designed circuit portions typically test them, so some circuit designers who use them may elect to perform a gate level simulation only on the circuitry they add outside the previously designed circuit portions. Such circuit designers will therefore generally replace a gate level netlist of a previously designed circuit portion for example, that is computationally expensive to simulate, with a more abstracted equivalent circuit for faster simulation. For example, an ILM generator may produce an equivalent flattened Verilog netlist describing the previously designed circuit portion. Such a netlist may contain only the interface timing from the inputs to the first flip-flops and from the last flip-flops to the outputs, and clock information.

The ILM therefore contains only the logic related to timing paths that originate or terminate outside the previously designed circuit portion, in circuitry the designer is adding. Such paths may include register-to-register logic, and extend between clocked storage elements. Active reduction technologies may help identify such timing paths, and determine critical timing paths. Such circuit reduction may sharply reduce memory requirements. The designer may therefore focus only on quickly designing the circuitry used to connect particular timing paths to the previously designed and tested circuit portions.

In other words, an ILM is intended to simplify the modeling of what is inside a given circuit boundary. In contrast, a reverse interface logic model (referred to herein as "ReverseILM") is similarly intended to simplify the modeling of what is outside a given circuit boundary. Thus, the ReverseILM represents the interface logic on circuit paths that cross and extend outside the boundaries of the optimization region, up until the first register encountered. ReverseILM is described in detail in U.S. patent application Ser. No. 14/062,807, which is herein incorporated by reference in its entirety.

One of the main advantages of ILM is that it allows abstraction of previously analyzed design IP. Accordingly, multiple instances of the same design IP incorporated in the same IC design could be represented by a single instance of the abstraction. ReverseILM takes ILM a step further by allowing abstraction of larger areas of an IC design outside the design IP.

Inefficiencies arise when trying to optimize multiple instances of the same design IP using ReverseILM. While each instance of the design IP is the same internally, when using ReverseILM adding the additional circuitry outside the design IP may make their optimization unique. This means that multiple instances of the same design IP may no longer be represented by a single block netlist in the optimization. Moreover, any optimizations to any individual design will need to be propagated and confirmed through each instance of the design IP. This process of "syncing" up each instance of the same design IP may be computationally intensive and time consuming. Accordingly, it would be advantageous if multiple instances of the same design IP could be represented as a single block netlist during optimization such that optimization would automatically flow through to each instance on the IC. This may be particularly helpful in IC that include master-clone scenarios.

Figure 3:
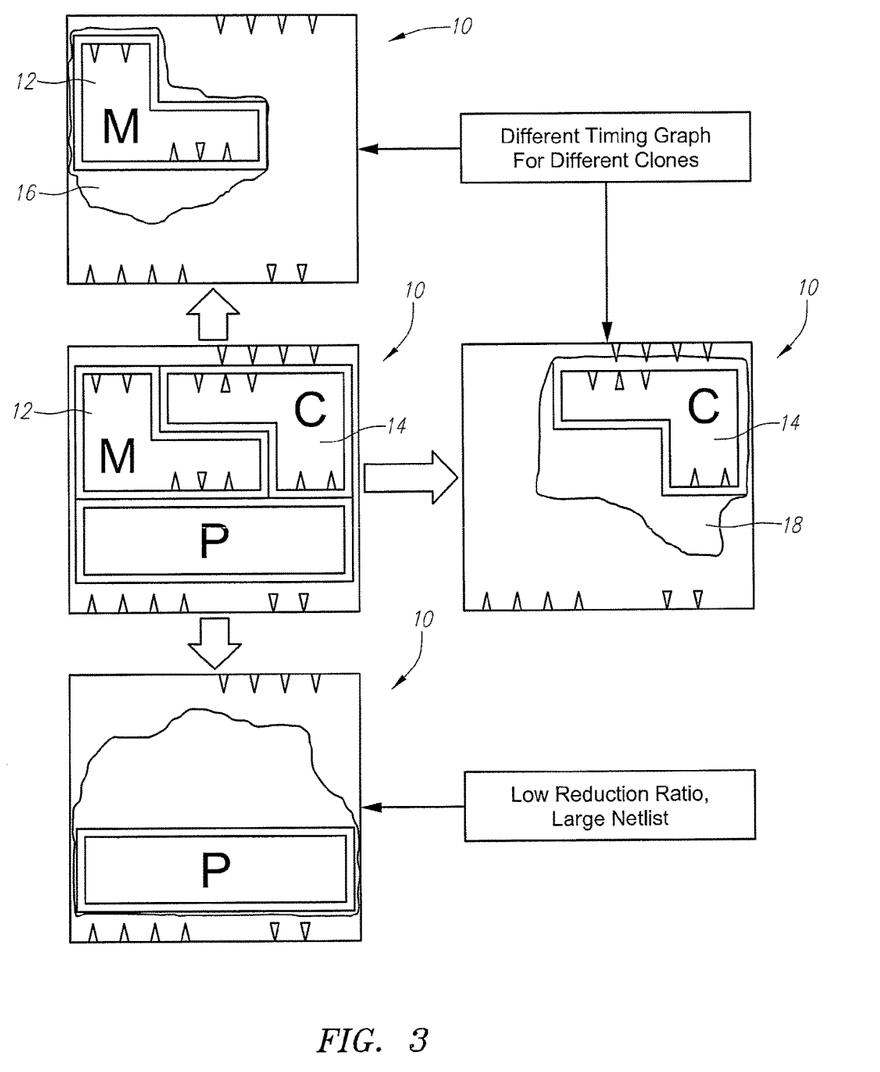
FIG. 3 illustrates an integrated circuit design including a master and a clone along with their unique timing environments.

FIG. 3 illustrates an IC with a master clone pair. As may be seen in FIG. 3., an IC design 10 may include a master 12 and a clone 14. In certain embodiments, a master 12 and clone 14 are any two portions of an IC design that may be represented by the same block netlist. As one example, the master 12 and clone 14 may each be a processor in a dual-core integrated circuit design. However, the master 12 and clone 14 are not limited to processors and may be any piece of duplicated design IP incorporated on the same IC 10.

Although the master 12 and clone 14 may each themselves be represented by the same block netlist, they may not have the same requirements or exist in the same environment. In particular, the master 12 and clone 14 may have very different operating environments and thus, different timing requirements and/or timing graphs, different power requirements, different performances and/or different area constraints. As may be seen in FIG. 3., when the external circuitry 16 and 18 that operate in conjunction with the master 12 and clone 14 respectively are added to the master 12 and clone 14, the analysis and optimization of each becomes unique. The addition of the external circuitry 16 and 18 may be important to the analysis and optimization of the master 12 and clone 14 and in preferred embodiments, is analyzed in conjunction with the master 12 and clone 14. This may be done, for example, as part of a ReverseILM analysis.

The embodiments described herein offer a way to include the unique circuitry surrounding a master 12 and clone 14 while still representing both the master and clone as a single block netlist, thus avoiding master-clone sync-up.

Although in the embodiments discussed herein, a master 12 with a single clone 14 is used, other embodiments may use two, three, four, five or more clones. There is no limit to the number of clones that may be handled under the techniques discussed herein. In embodiments with more than one clone 14, different clones may each have different environments and requirements and in particular, different timing graphs. Moreover, the embodiments are not limited to only master-clone scenarios and the embodiments may be applied to any design IP that has multiple instances on the same IC. To this end, an instance of a master 12 or clone 14 or repeated piece of design IP, may generically be referred to as a target block 19.

Figure 4:
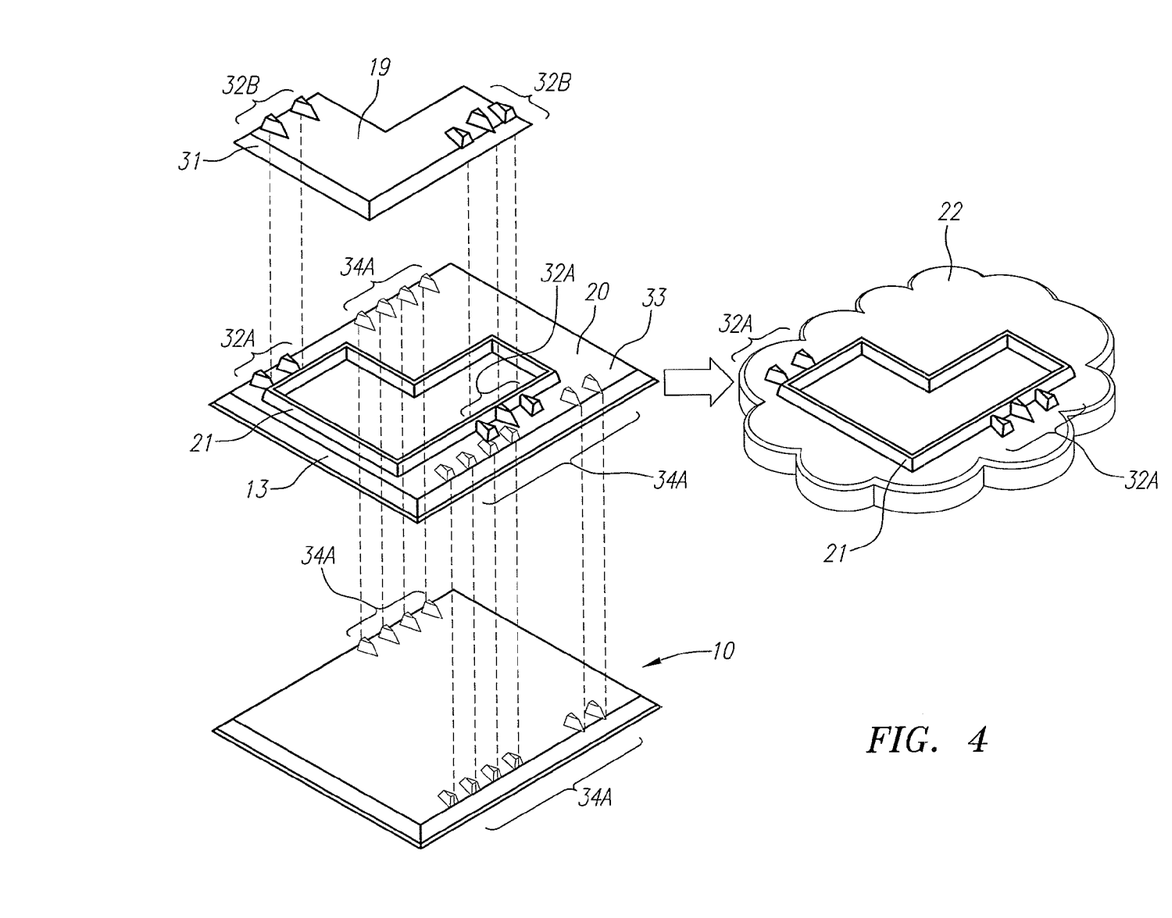
FIG. 4 illustrates one embodiment of an integrated circuit design being separated into a target block and a donut macro.

FIG. 4 illustrates one embodiment of an integrated circuit design 10 being separated into a target block 19, donut macro 20, and cloud library 22. The process shown in FIG. 4 abstracts the master 12 and clone 14 as a single target block 19 because the process of FIG. 4 is equally applicable to both the master 12 and clone 14 (shown in FIG. 3), and is repeated for each. Accordingly, the process shown in FIG. 4 may be performed on the master 12 as well as the clone 14, abstracted here as the target block 19.

After one or more target blocks 19 are identified, which may occur automatically by software or manually by the design engineer, an area 33 outside each target block 19 is selected. The area 33 outside the target block 19 may be any area. However, in preferred embodiments, the outside area 33 is the entire chip outside the target block 19. Accordingly, circuit paths that are physically connected and proceed outward from the target block 19 may be included in the outside area 33 of the macro. The circuit paths emanating out of the target block 19 up until they terminate in clocked storage elements may be included. The storage elements may comprise flip-flops and registers. In embodiments where the entire chip outside the target block is not used as the outside area 33, the area preferably includes any circuitry that may affect the optimization of the target block 19.

After the area 33 outside the target block 19 is defined, the area 33 is converted to a donut macro 20. Once the timing information is extracted, the donut macro 20 may consist of a cloud library 22 and timing library 23.

As may be appreciated from the figures, all the instances of the target block 19, whether they originate from the master 12 or clone 14, have the same pin configuration on their external interface 32B because they are different instances of the same design IP. In addition, where the area outside the target block 19 is selected as the area of the entire chip, the chip I/O has the same exterior pin configuration 34B. This matching pin configuration allows the decoupling of the relative physical location of internal and external boundaries of the macros 20.

After each of the macros 20 has been created, the logical decoupling is complete and each instance of the target block 19 may be represented by a single block netlist. The block netlist may be optimized with respect to the macros 20 of each of the target blocks 19. One advantage of this approach is that it creates a small predictable netlist consisting of a single block netlist and one macro for each instance of the target block 19.

Figure 5:
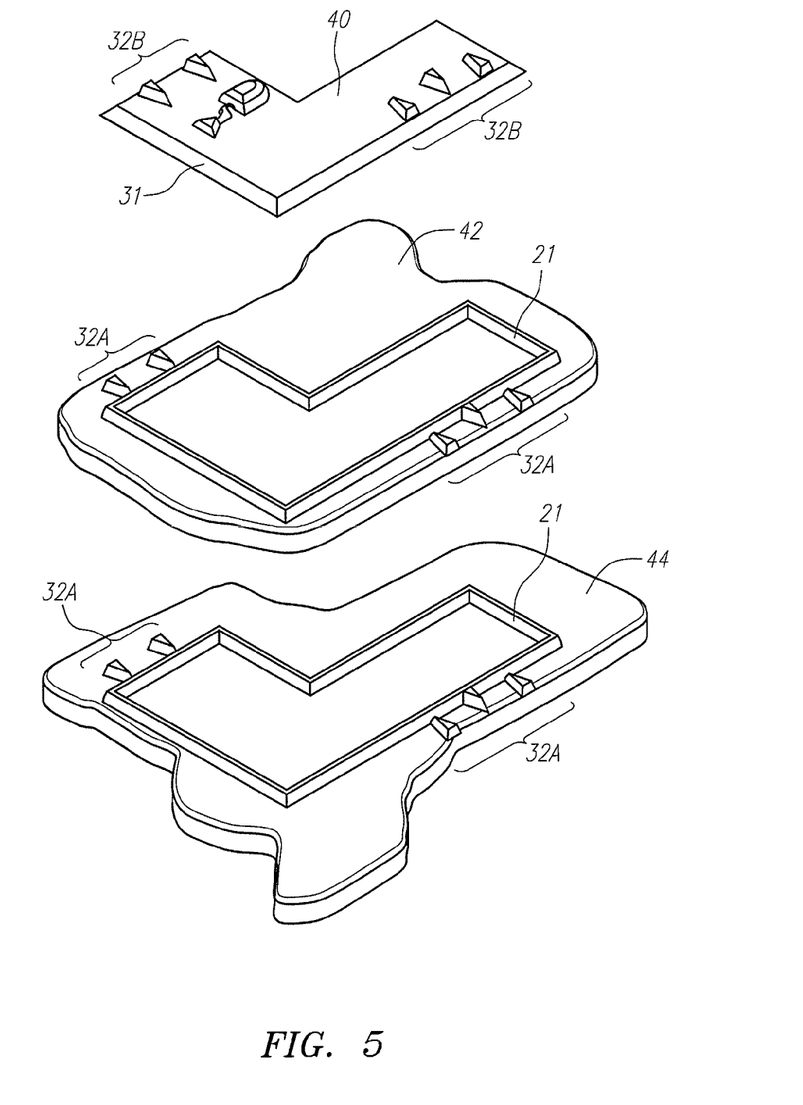
FIG. 5 illustrates one embodiment of optimizing a master clone pair using a single block netlist and mode/corner definitions of the timing libraries for the master and clone(s).

FIG. 5 illustrates one embodiment of a method of optimizing the single block netlist 40. Each macro 20 for each master and clone has a timing library 42 and 44 extracted from it respectively. The block netlist 40 may then be optimized for timing in the presence of the timing libraries 42 and 44. Timing optimizations in a circuit may be performed by modifying a critical net to include additional buffers, repeaters, or by resizing gates within the net.

The optimizing step further comprises defining a first mode/corner definition for the master's timing library 42 and a second mode/corner definition for the clone's timing library 44 and combining the first mode/corner definition and the second mode/corner definition into a single multi-mode multi-corner (MMMC) definition. After creating a single MMMC definition the single block netlist may be optimized using the MMMC definition. To this end, in a preferred embodiment, the timing libraries 42 and 44 are converted into an MMMC timing constraint for the block netlist.

Although in a preferred embodiment, the timing libraries 42 and 44 are combined using MMMC, in other embodiments, the timing libraries for the master 12 and clone 14 may be combined using other methods allowing a single block netlist to be analyzed with respect to all the timing libraries at once.

By representing multiple instances of the same design IP using a single block netlist 40 and optimizing that single block netlist with respect to various different donut macros, efficiencies may be gained. Because the physical information about the external boundaries of the donut macro may be ignored, a "cloud" library may be used and a multi-mode multi-corner ("MMMC") infrastructure may be applied. The methods, systems and apparatus described herein may be used in conjunction with a ReverseILM analysis or as part of other types of analysis and/or optimization.

The methods, systems and apparatus described herein are preferably used to optimize the timing of the master 12 and clone 14. However, in other embodiments other aspects may be optimized. For example, the methods, systems and apparatus disclosed herein may be used to optimize performance, power or area ("PPA"). During the optimization process, the netlist of the master and/or clone may be modified to reflect the optimization.

The methods described above, although described as methods, may take numerous different forms. In one embodiment they may take the form of a computer-implemented method for optimizing a circuit design. In another embodiment, they may take the form of a non-transitory computer readable medium storing instructions that, when executed by a processor, perform one or more of the methods. In other embodiments, they may take the form of a system including memory storing executable instructions and a processor executing the instructions wherein the instructions implement one or more of the methods described herein.

Although the embodiments have been described with reference to preferred configurations and specific examples, it will readily be appreciated by those skilled in the art that many modifications and adaptations of the systems and methods described herein are possible without departure from the spirit and scope of the embodiments as claimed hereinafter. Thus, it is to be clearly understood that this description is made only by way of example and not as a limitation on the scope of the embodiments.

What is claimed is:

1. A computer-implemented method for optimizing a circuit design stored in a computer memory, the method comprising:
   identifying a target block with an external boundary and external boundary pins in an integrated circuit design;
   converting an area outside the target block into a first macro, wherein the first macro has a physical library and a timing library, wherein the physical library represents physical attributes of the area outside the target block including an internal boundary that corresponds to the external boundary of the target block and internal boundary pins that correspond to the external boundary pins of the target block, wherein the timing library represents the timing information of the area outside the target block;
   representing the target block as a netlist;
   using a computer, optimizing timing characteristics of the netlist with respect to the first macro, wherein optimizing is performed by modifying the netlist to include additional buffers, repeaters, or by re zing gates within a net;

wherein the identifying and converting steps are performed with both a master and a clone as the target block forming a first macro and a second macro, and both the master and clone are represented by a netlist in the representing step, and the netlist is optimized with respect to both the first and second macro in the optimizing step; and wherein the optimizing step further comprises defining a first mode/corner definition for a first timing library of the first macro and a second mode/corner definition for a second timing library of the second macro and combining the first mode/corner definition and the second mode/corner definition into a single multi-mode multi-corner definition and optimizing the block netlist using the multi-mode multi-corner definition.

2. The method of claim 1, wherein the identifying and converting steps are performed with both a first piece of design IP and a second identical piece of design IP as the target block forming a first macro and a second macro, and both the first piece of design IP and the second piece of design IP are represented by a netlist in the representing step, and the block netlist is optimized with respect to both the first and second macro in the optimizing step.

3. The method of claim 1, wherein the first macro is a donut macro.

4. The method of claim 1, wherein the physical library is a cloud library.

5. The method of claim 1, wherein the physical library includes information that corresponds to the external boundary of the integrated circuit and the information that corresponds to the external boundary of the integrated circuit is not used during the optimizing step.

6. The method of claim 1, wherein the area outside the target block corresponds to the entire area of the integrated circuit outside the target block.

7. The method of claim 1 implemented as part of a ReverseILM analysis.

8. The method of claim 1, wherein the optimizing step optimizes the timing of the block netlist.

9. The method of claim 2, wherein the master and clone are both processor cores.

10. The method of claim 1, wherein the optimizing step optimizes a property selected from the group consisting of performance, power and area.

11. A non-transitory computer readable medium storing instructions that, when executed by a processor, perform a method for optimizing a circuit design stored in a computer memory comprising:

identifying a target block with an external boundary and external boundary pins in an integrated circuit design;

converting an area outside the target block into a first macro, wherein the first macro has a physical library and a timing library, wherein the physical library represents physical attributes of the area outside the target block including an internal boundary that corresponds to the external boundary of the target block and internal boundary pins that correspond to the external boundary pins of the target block, wherein the timing library represents the timing information of the area outside the target block;

representing the target block as a netlist; and, using a computer, optimizing timing characteristics of the netlist with respect to the first macro, wherein optimizing is performed by modifying the netlist to include additional buffers, repeaters, or by re zing gates within a net;

wherein the identifying and converting steps are performed with both a master and a clone as the target block forming a first macro and a second macro, and both the master and clone are represented by a netlist in the representing step, and the block netlist is optimized with respect to both the first and second macro in the optimizing step; and wherein the optimizing step further comprises defining a first mode/corner definition for a first timing library of the first macro and a second mode/corner definition for a second timing library of the second macro and combining the first mode/corner definition and the second mode/corner definition into a single multi-mode multi-corner definition and optimizing the block netlist using the multi-mode multi-corner definition.

12. The medium of claim 11, wherein the identifying and converting steps are performed with both a first piece of design IP and a second identical piece of design IP as the target block forming a first macro and a second macro, and both the first piece of design IP and the second piece of design IP are represented by a netlist in the representing step, and the block netlist is optimized with respect to both the first and second macro in the optimizing step.

13. The medium of claim 11, wherein the first macro is a donut macro.

14. The medium of claim 11, wherein the physical library is a cloud library.

15. The medium of claim 11, wherein the physical library includes information that corresponds to the external boundary of the integrated circuit and the information that corresponds to the external boundary of the integrated circuit is not used during the optimizing step.

16. The medium of claim 11, wherein the area outside the target block corresponds to the entire area of the integrated circuit outside the target block.

17. The medium of claim 11 implemented as part of a ReverseILM analysis.

18. The medium of claim 11, wherein the optimizing step optimizes the timing of the block netlist.

19. The medium of claim 14 wherein the master and clone are both processor cores.

20. The medium of claim 11, wherein the optimizing step optimizes a property selected from the group consisting of performance, power and area.

21. A computer-implemented method for optimizing a circuit design stored in a computer memory, the method comprising:

identifying a master having external boundary pins and a clone having external boundary pins in an integrated circuit design having input output pins;

converting an area outside the master into a first macro with internal boundary pins corresponding to the external boundary pins of the master and external boundary pins corresponding to the input output pins of the integrated circuit;

converting an area outside the clone into a second macro with internal boundary pins corresponding to the external boundary pins of the clone and external boundary pins corresponding to the chip input output pins;

representing both the master and the clone with a netlist; and, using a computer, optimizing timing characteristics of the netlist with respect to the first macro and the second macro, wherein optimizing is performed by modifying the netlist to include additional buffers, repeaters, or by resizing, gates within a net;

wherein the optimizing step further comprises defining a first mode/corner definition for a first timing library of the first macro and a second mode/corner definition for a second timing library of the second macro and combining the first mode/corner definition and the second mode/corner definition into a single multi-mode multi-corner definition and optimizing the block netlist using the multi-mode multi-corner definition.

* * * * *